United States Patent
Horibe et al.

(10) Patent No.: US 10,388,578 B2
(45) Date of Patent: Aug. 20, 2019

(54) WAFER SCALE TESTING AND INITIALIZATION OF SMALL DIE CHIPS

(71) Applicant: INTERNATIONAL BUSINESS MACHINES CORPORATION, Armonk, NY (US)

(72) Inventors: Akihiro Horibe, Kanagawa-ken (JP); Yasuteru Kohda, Kanagawa-ken (JP); Seiji Munetoh, Tokyo (JP); Chitra Subramanian, Mahopac, NY (US); Kuniaki Sueoka, Kanagawa-ken (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/795,888

(22) Filed: Oct. 27, 2017

(65) Prior Publication Data

US 2019/0103328 A1   Apr. 4, 2019

Related U.S. Application Data

(63) Continuation of application No. 15/722,409, filed on Oct. 2, 2017.

(51) Int. Cl.
*H01L 21/77* (2017.01)
*H01L 21/66* (2006.01)

(52) U.S. Cl.
CPC .............. *H01L 22/30* (2013.01); *H01L 21/77* (2013.01); *H01L 22/32* (2013.01); *H01L 22/34* (2013.01); *H01L 2225/06596* (2013.01)

(58) Field of Classification Search
CPC ......... H01L 22/30; H01L 22/32; H01L 22/34; H01L 21/78; H01L 2225/06596

USPC .................................................. 257/48, 620
See application file for complete search history.

(56) References Cited

U.S. PATENT DOCUMENTS

| | | | | |
|---|---|---|---|---|
| 6,744,067 B1 * | 6/2004 | Farnworth | ......... | G01R 31/2856 257/48 |
| 2004/0135231 A1 * | 7/2004 | Keller | ................ | G01R 31/2884 257/620 |
| 2014/0051189 A1 | 2/2014 | Kai-Jun et al. | | |

(Continued)

FOREIGN PATENT DOCUMENTS

| CN | 1435872 A | 8/2003 |
|---|---|---|
| CN | 1635619 A | 7/2005 |
| CN | 101996991 A | 3/2011 |

OTHER PUBLICATIONS

List of IBM Patents or Patent Applications Treated as Related dated Oct. 27, 2017, 2 pages.

(Continued)

*Primary Examiner* — Matthew E Warren
(74) *Attorney, Agent, or Firm* — Tutunjian & Bitetto, P.C.; Vazken Alexanian

(57) ABSTRACT

A chip intermediate body includes a semiconductor region including plural chip areas. The chip areas respectively are cut out as semiconductor chips. A cut region is provided along edges of the chip areas, the cut region being cut to cut out the semiconductor chips. A contact region is provided opposite to the chip areas across the cut region, the contact region being configured to be contacted by a probe of a test unit to test the chip areas, and electric wiring is provided continuously with the cut region to connect the chip areas and the contact region.

10 Claims, 6 Drawing Sheets

(56) References Cited

U.S. PATENT DOCUMENTS

2016/0084882 A1 3/2016 Dang et al.
2016/0274183 A1 9/2016 Wu et al.

OTHER PUBLICATIONS

International Search Report issued in PCTIB2018057532 dated Jan. 21, 2019, 9 pages.

* cited by examiner

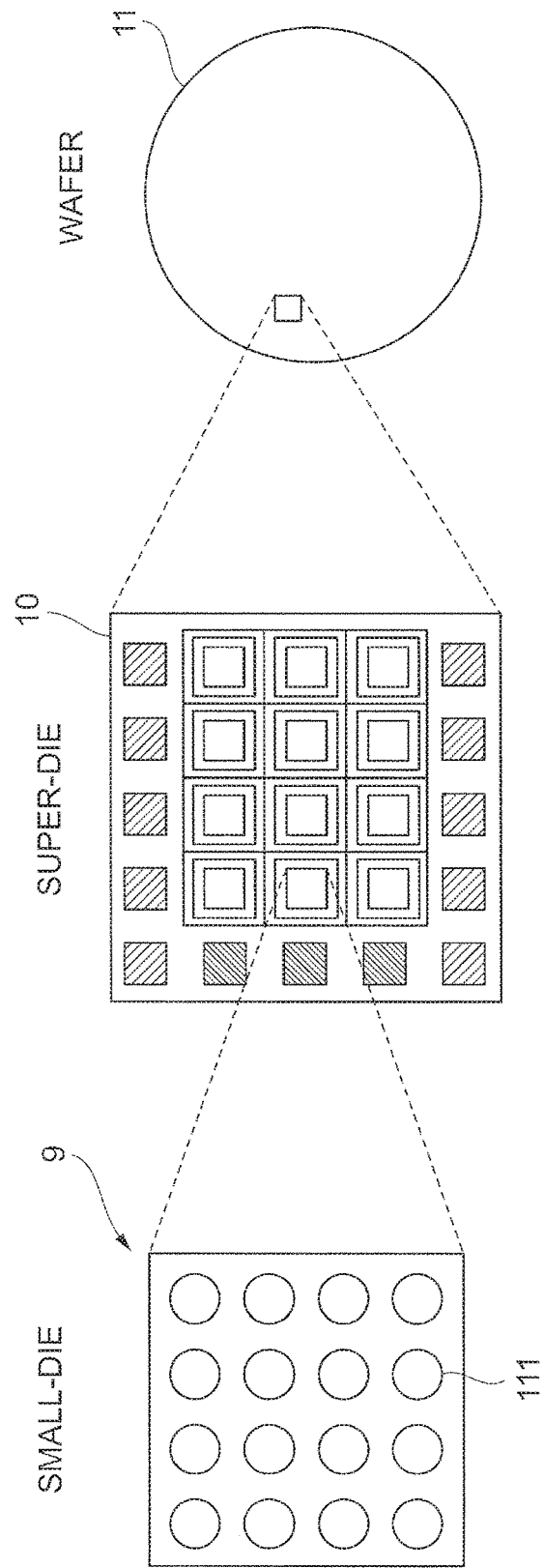

WAFER SCALE TESTING AND INITIALIZATION OF SMALL DIE CHIPS

BACKGROUND

Technical Field

The present invention relates to testing multiple semiconductor chips.

Related Art

Recently, various techniques have been known regarding testing multiple semiconductor chips.

SUMMARY

According to embodiments of the present invention, there is provided a chip intermediate body. The chip intermediate body includes a semiconductor region, a cut region, a contact region, and electric wiring. The semiconductor region includes plural chip areas. The chip areas are respectively cut out as semiconductor chips. The cut region is provided along edges of the chip areas. The cut region is cut to cut out the semiconductor chips. The contact region is provided opposite to the chip areas across the cut region. The contact region is contacted by a probe of a test unit to test the chip areas. The electric wiring is provided continuously with the cut region to connect the chip areas and the contact region.

According to another embodiment of the present invention, there is provided a chip intermediate body manufacturing system for manufacturing a chip intermediate body. The chip intermediate body includes a semiconductor region, a cut region, a contact region, and electric wiring. The semiconductor region includes plural chip areas. The chip areas are respectively cut out as semiconductor chips. The cut region is provided along edges of the chip areas. The cut region is cut to cut out the semiconductor chips. The contact region is provided opposite to the chip areas across the cut region. The contact region is contacted by a probe of a test unit to test the chip areas. The electric wiring is provided continuously with the cut region to connect the chip areas and the contact region.

According to yet another embodiment of the present invention, there is provided a semiconductor chip manufacturing system. The semiconductor chip manufacturing system includes a fabrication unit, a test unit, and a separation unit. The fabrication unit fabricates a chip intermediate body including a semiconductor region, a cut region, a contact region, and electric wiring. The semiconductor region includes plural chip areas respectively cut out as semiconductor chips. The cut region is provided along edges of the chip areas. The cut region is cut to cut out the semiconductor chips. The contact region is provided opposite to the chip areas across the cut region. The electric wiring is provided continuously with the cut region to connect the chip areas and the contact region. The test unit tests the chip areas. The test unit includes a probe to contact the contact region to test the chip areas. The separation unit cuts the cut region to cut out the semiconductor chips.

According to yet another embodiment of the present invention, there is provided a method for testing a chip area. The method includes fabricating a chip intermediate body including a semiconductor region, a cut region, a contact region, and electric wiring. The semiconductor region includes plural chip areas respectively cut out as semiconductor chips. The cut region is provided along edges of the chip areas. The cut region is cut to cut out the semiconductor chips. The contact region is provided opposite to the chip areas across the cut region. The electric wiring is provided continuously with the cut region to connect the chip areas and the contact region. The method further includes testing the chip areas with a probe of a test unit contacting the contact region.

According to yet another embodiment of the present invention, there is provided a method for fabricating a semiconductor chip. The method includes testing a semiconductor region provided on a chip intermediate body with a probe of a test unit, the chip intermediate body including the semiconductor region, a cut region, a contact region, and electric wiring. The semiconductor region includes plural chip areas respectively cut out semiconductor chips. The cut region is provided along edges of the chip areas. The cut region is cut to cut out the semiconductor chips. The contact region is provided opposite to the chip areas across the cut region. The electric wiring is provided continuously with the cut region to connect the chip areas and the contact region. The method further includes cutting the cut region to cut out the semiconductor chips.

BRIEF DESCRIPTION OF THE DRAWINGS

FIG. 2A depicts a schematic view of a small-die according to the exemplary embodiment.

FIG. 2B depicts a schematic view of a super-die according to the exemplary embodiment.

FIG. 2C depicts a schematic view of a semiconductor wafer according to the exemplary embodiment.

DETAILED DESCRIPTION

Hereinafter, exemplary embodiments of the present invention will be described in detail with reference to the attached drawings.

It is to be noted that the present invention is not limited to these exemplary embodiments to be given below and may be implemented with various modifications within the scope of the present invention. In addition, the drawings used herein are for purposes of illustration, and may not show actual dimensions.

Figure 1:
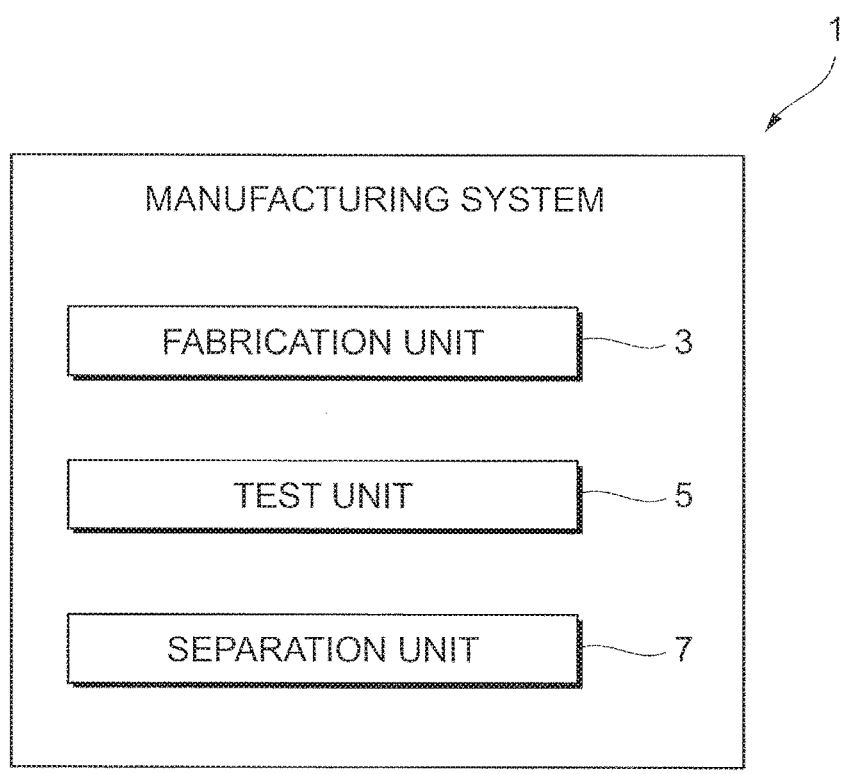
FIG. 1 depicts a block diagram showing a configuration of a manufacturing system according to an exemplary embodiment of the present invention.

FIG. 1 depicts a block diagram showing a configuration of a manufacturing system 1 according to an exemplary embodiment of the present invention.

As shown in FIG. 1, the manufacturing system 1 may include a fabrication unit 3, a test unit 5, and a separation unit 7.

The fabrication unit 3 fabricates a semiconductor wafer using a conventional semiconductor manufacturing technique. The technique may include a front end of line (FEOL), a back end of line (BEOL), and a chemical mechanical polishing (CMP). From the semiconductor wafer, multiple semiconductor chips (e.g., micro chips) are cut out. This exemplary embodiment assumes that the size of the semiconductor chips is small (described later). Hereinafter, the semiconductor chip is referred to as a small-die.

The test unit 5 is provided for a logic test and an initialization of the multiple small-dies on the semiconductor wafer. The test unit 5 may be conventional (existing) testing equipment. Note that the test unit 5 may include test probes 50 (described later). The test unit 5 writes initial data to each of the multiple small-dies and confirms their operation using the test probes 50.

The separation unit 7 separates (cuts) the semiconductor wafer into individual small-dies. The separation unit 7 cuts the semiconductor wafer by reactive ion etching (RIE). Note that other conventional cutting techniques, such as blade or laser cutting, are also applicable to the separation unit 7.

FIG. 2A depicts a schematic view of a small-die 9 according to the exemplary embodiment. FIG. 2B depicts a schematic view of a super-die 10 according to the exemplary embodiment. FIG. 2C depicts a schematic view of a semiconductor wafer 11 according to the exemplary embodiment.

As shown in FIG. 2A, the small-die 9 is a plate member and has a generally square shape in a plane view. The small-die 9 may include multiple micro bumps 111 on the surface thereof. The micro bumps 111 are protruding electrodes provided on the surface of the small-die 9 by vapor deposition, plating or printing, for example. Note that the micro bumps 111 are contact points when the small-die 9 is mounted on a wiring board (not shown).

As mentioned above, this exemplary embodiment assumes that the size of the small-die 9 is small. The size (width) of the small-die 9 is less than 1 mm, and preferably about 50 um (micrometers) to about 500 um. In the example shown in the figure, the size of the small-die 9 is about 100 um. Further, the multiple micro bumps 111 are provided with, e.g., 20 um pitch.

As shown in FIG. 2B, the super-die 10 is a plate member and has a generally square shape in a plane view. The super-die 10 may include multiple small-dies 9. The configuration of the super-die 10 will be described later with reference to FIG. 3. The size (width) of the super-die 10 is, e.g., 3 mm to 50 mm, preferably 5 mm to 30 mm. The super-die 10 is an example of an intermediate body.

As shown in FIG. 2C, the semiconductor wafer 11 is a plate member and has a generally round shape in a plane view. The semiconductor wafer 11 may include multiple super-dies 10. The size (diameter) of the semiconductor wafer 11 is 300 mm or 450 mm, for example.

Assuming that the size of the small-die 9 is 100 um×100 um, the size of the super-die 10 is 6.8 mm×6.8 mm, and the diameter of the semiconductor wafer 11 is 300 mm, approximately 7 million pieces of the small-dies 9 can be provided in a single semiconductor wafer 11. Similarly, approximately 1,500 pieces of the super-dies 10 can be provided in the single semiconductor wafer 11. Further, approximately 4,000 (64×64) pieces of the small-dies 9 can be provided in a single super-die 10.

Here, the present exemplary embodiment assumes that the small-die 9 does not meet a requirement for a test with the existing manufacturing test method. In other words, the size of the small-die 9 is too small to be testable by the test unit 5. If the small-die 9 requires dedicated test equipment, production costs (in particular, logic testing costs and the initialization costs) of the small-dies 9 increase.

In the present exemplary embodiment, the super-die 10 provided with the multiple small-dies 9 can be tested by the test unit 5 (see FIG. 1), i.e., by the existing testing equipment. In other words, the size of the super-die 10 is defined to be within size limits for the test unit 5. Note that the super-die 10 may behave as a standard die. This enables a reduction in the production costs of the small-dies 9.

Note that the pitch between the micro bumps 111 is too narrow for the test unit 5. In other words, arrangement of the micro bumps 111 is not appropriate to be probed (contacted) by the probes 50 of the test unit 5.

Figure 3A:
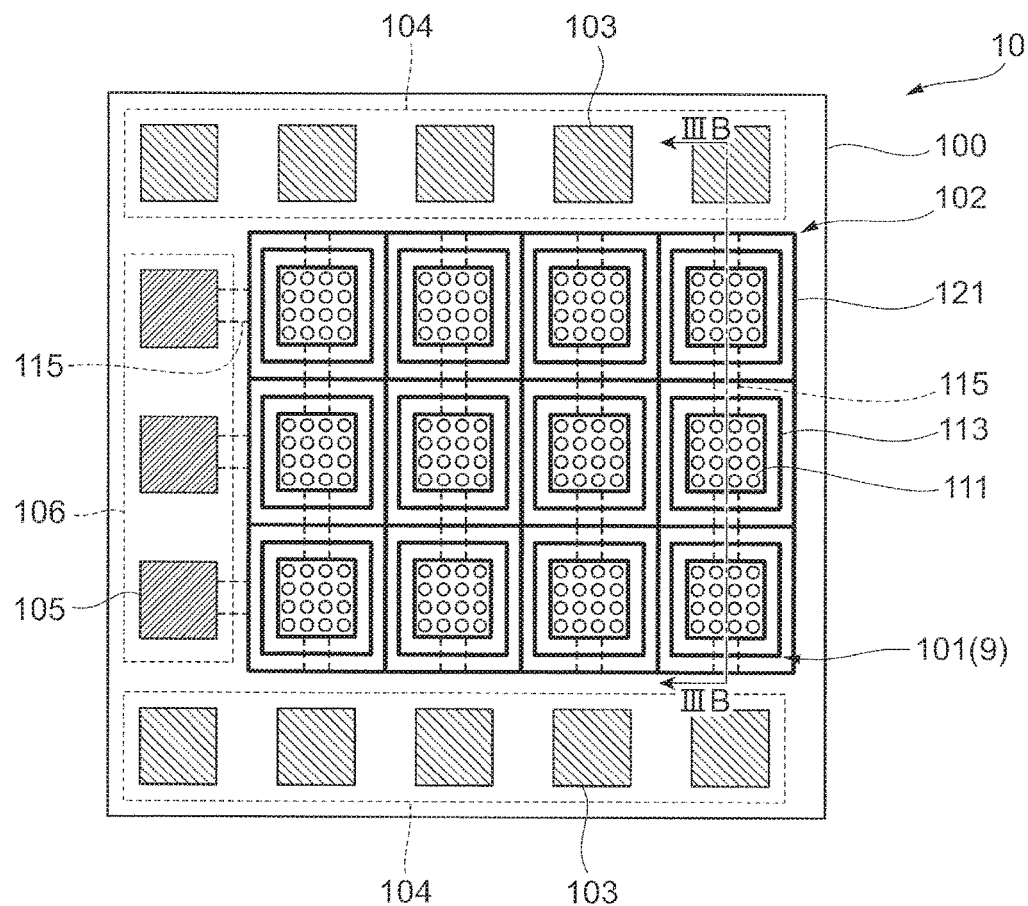
FIG. 3A depicts a schematic view of the super-die according to the exemplary embodiment.
Figure 3B:
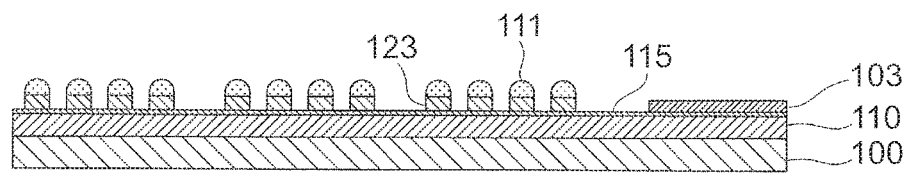
FIG. 3B depicts a schematic cross-sectional view taken along the line IIIB-IIIB in FIG. 3A.

FIG. 3A depicts a schematic view of the super-die 10 according to the exemplary embodiment. FIG. 3B depicts a schematic cross-sectional view taken along the line IIIB-IIIB in FIG. 3A. Referring to FIGS. 3A and 3B, a detailed explanation is given about the configuration of the super-die 10.

The super-die 10 is provided with a substrate (e.g. Si wafer) 100. As shown in FIG. 3B, a base circuit 110 (described later) is provided on the substrate 100 to form the multiple small-dies 9. The base circuit 110 may include circuit wires 131 (see FIG. 5A) and an insulating layer 132 (see FIG. 5A). The circuit wires 131 constitute circuits for operating the small-dies 9. The circuit wires 131 may be made of cupper (Cu). The insulating layer 132 may be, e.g., a $SiO_2$.

As shown in FIG. 3A, the super-die 10 is provided with chip areas 101, test pads 103, and test circuits 105. These elements, e.g., the chip areas 101, the test pads 103, and the test circuits 105, are electrically connected by wiring circuits 115 and a scribe circuit 121, in the present exemplary embodiment.

Each of the chip areas 101 is an area corresponding to one small-die 9. In other words, the small-die 9 can be obtained by cutting out the chip area 101. Note that a group of multiple chip areas 101 is integrally formed on the substrate 100. In other words, the substrate 100 includes an integral area 102 for an M×N (e.g. 3×4 in FIG. 3A) cluster of the small-dies 9. The integral area 102 is an example of a semiconductor region.

The chip area 101 includes the micro bumps 111. The micro bumps 111 are formed on tops of corresponding pillars 123. The pillar 123 may be made of cupper (Cu). Further, the chip area 101 includes a die edge seal 113. The die edge seal 113 is a structure for protecting the small die 9 from moisture and static electricity, for example. In the example shown in the figure, the die edge seal 113 is provided along the edges of the chip area 101. Note that the chip area 101 may include a nonvolatile random access memory (NVRAM, not shown) where initial data is written.

The test pads 103 are pads (standard pads) provided on the surface of the base circuit 110. Each of the test pads 103 is to be contacted by a corresponding one of the test probes 50 in the logic test. In the present exemplary embodiment, the test pads 103 are arranged around the integral area 102. In other words, the test pads 103 are provided along the edges of the integral area 102 (the super-die 10). Here, a pad area 104 including the test pads 103 is provided opposite to the integral area 102 across the scribe circuit 121.

The test pads 103 may be provided in a predetermined pitch, e.g., 50 um. The predetermined pitch is an appropriate pitch for the test pads 103 to be probed by the probes 50. In the example shown in the figure, each of the test pads 103 has a larger area than each of the micro bumps 111.

The test circuits 105 are circuits for the logic test. For example, the test circuits 105 include circuits of charge pumps to write initial data to the multiple small-dies 9. The test circuits 105 may be additional test and programming circuit modules of the small-dies 9. Further, the test circuits 105 are shared by at least two small-dies 9 in the present exemplary embodiment. The test circuits 105 are provided for respective rows of the chip areas 101 to write data to the chip area 101 in the corresponding row. Here, a test area 106 including the test circuits 105 is provided opposite to the integral area 102 across the scribe circuit 121.

The wiring circuits 115 are wiring straps crossing the die edge seals 113. The wiring circuits 115 are provided on the base circuit 110. In other words, the wiring circuits 115 may be a last metal layer (LB layer). The wiring circuits 115 electrically connect the chip areas 101, the test pads 103, the test circuits 105, and the scribe circuits 121. In the example shown in the figure, the wiring circuits 115 are provided continuously with the scribe circuit 121. The wiring circuits 115 are an example of electric wiring.

The scribe circuit 121 is an area including the circuit wires 131 to connect the chip areas 101, the test pads 103, and the test circuits 105. In other words, the circuit wires 131 in the scribe circuit 121 can be used with the wiring circuits 115 to increase the wiring density. The scribe circuit 121 is also to be scribed to cut out the small-dies 9. In the present exemplary embodiment, the scribe circuit 121 is scribed by reactive ion etching (RIE, described later). Note that the scribe circuit 121 has a lattice shape. In other words, the scribe circuit 121 is provided along the edges of the chip areas 101. Further, the scribe circuit 121 uses all layers of metal.

For example, the wiring circuits 115 are made of aluminum (Al). Further, as mentioned above, the circuit wires 131 are made of cupper (Cu). This exemplary embodiment assumes that the wiring circuits 115 can be cut by RIE, while the circuit wires 131 cannot be cut by RIE.

Figure 4A:
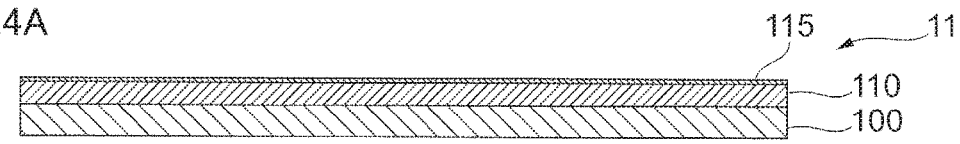
FIGS. 4A, 4B, 4C, 4D, 4E, 4F and 4G depict a fabrication process of the small-dies according to the exemplary embodiment.

FIGS. 4A to 4G depict a fabrication process of the small-dies 9 according to the exemplary embodiment. FIGS. 5A to 5C depict a cutting process of the small-die 9 according to the exemplary embodiment. FIGS. 5A to 5C respectively correspond to the processes shown in FIGS. 4E to 4G. Referring to FIGS. 1, 4A to 4G, and 5A to 5C, an explanation is given about a fabrication process of the small-dies 9 according to the exemplary embodiment.

The fabrication process of the small-dies 9 generally includes a semiconductor wafer fabricating (manufacturing) step conducted by the fabrication unit 3, a test and initialization step conducted by the test unit 5, and a cutting step conducted by the separation unit 7. In the present exemplary embodiment, the small-dies 9 integrally formed on the super-die 10 are cut out after the test and initialization step conducted by the test unit 5.

Hereinafter, a fabrication process of the small-dies 9 will be explained in detail. As shown in FIG. 4A, the fabrication unit 3 firstly provides the base circuit 110, which includes the circuit wires 131 and the insulating layer 132 (see FIG. 5A), on the substrate 100, and then forms the wiring circuits 115 on the base circuit 110. Note that the circuit wires 131 included in the chip areas 101 are examples of the circuit wiring, and the circuit wires 131 included in the scribe circuit 121 are examples of the other electric wiring. The circuit wires 131 in the chip areas 101 and the scribe circuit 121 are provided in the same layer of the base circuit 110.

Figure 4B:
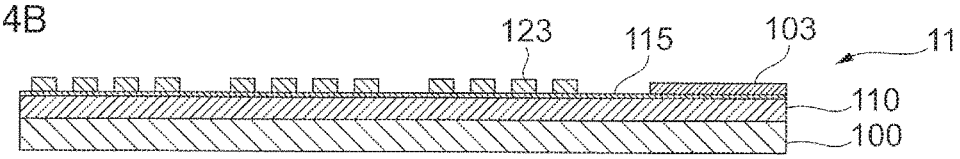
Figure 4C:
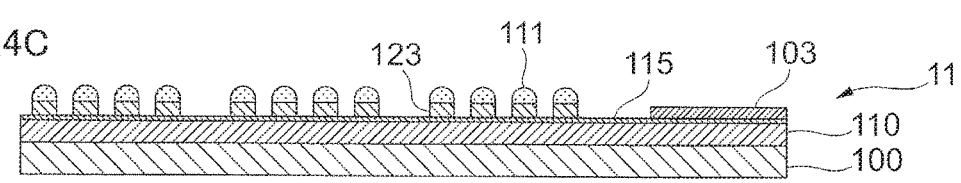
Figure 5A:
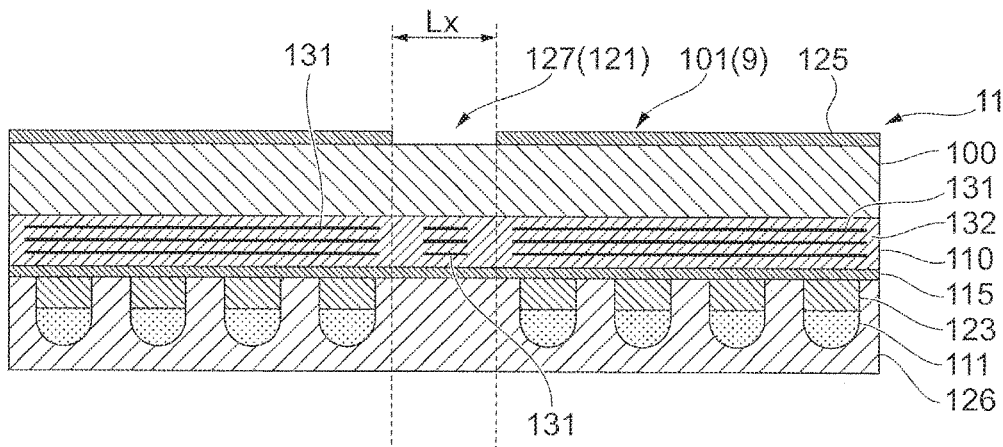
FIGS. 5A, 5B and 5C depict a cutting process of the small-die according to the exemplary embodiment.
Figure 5B:
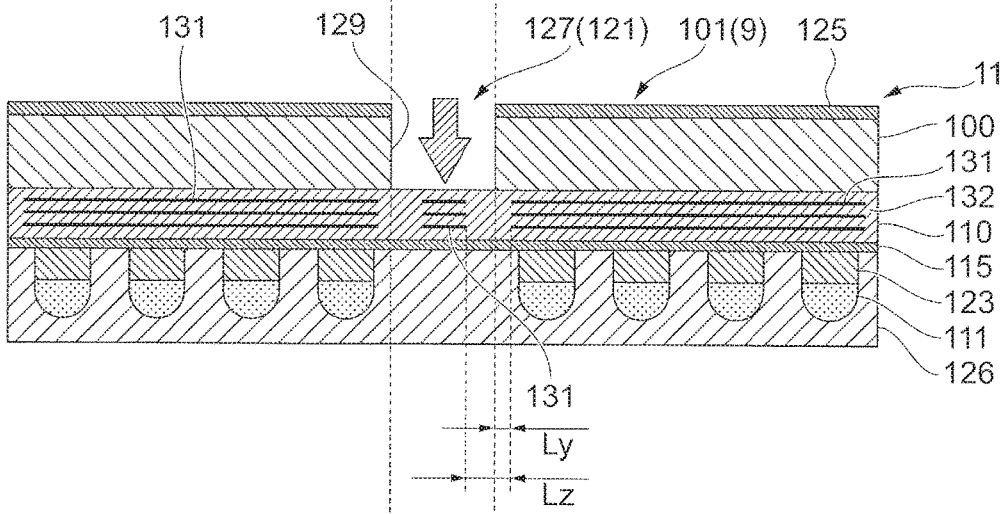
Figure 5C:
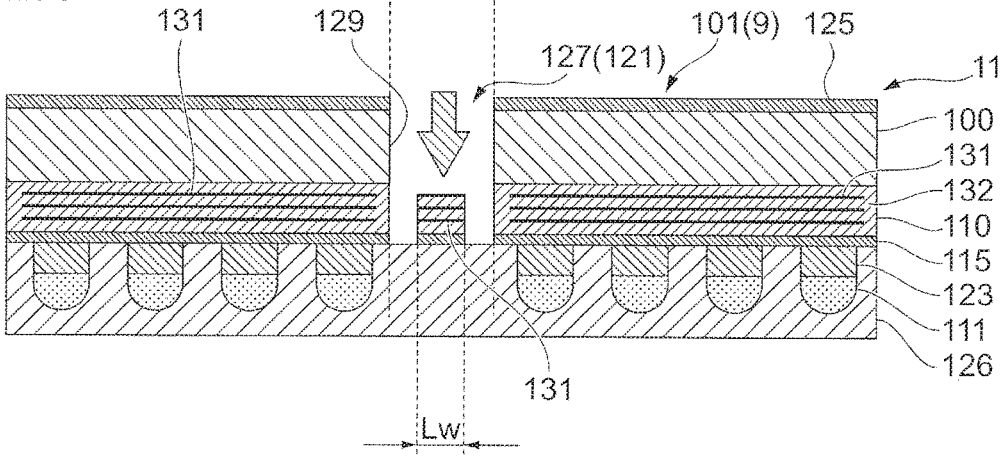

As shown in FIG. 4B, the fabrication unit 3 then provides the pillars 123 and the test pads 103 on the wiring circuits 115. As shown in FIG. 4C, the fabrication unit 3 then provides the micro bumps 111 on the tops of the corresponding pillars 123. The semiconductor wafer 11 is thus formed.

Note that the process shown in FIGS. 4A, 4B, 4C corresponds to the above mentioned semiconductor wafer fabricating (manufacturing) step.

Figure 4D:
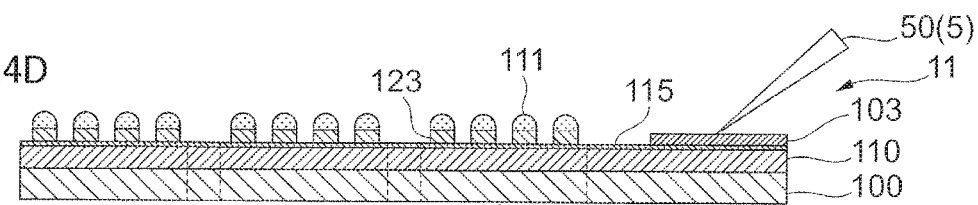

As shown in FIG. 4D, the test unit 5 then writes initial data to the chip areas 101 (the small-dies 9) and confirms their operation with the test probes 50 touching the test pads 103. Note that the process shown in FIG. 4D corresponds to the above mentioned test and initialization step.

Figure 4E:
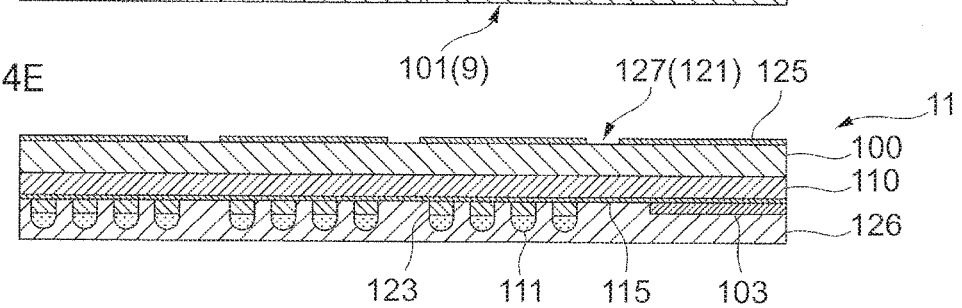

As shown in FIGS. 4E and 5A, the separation unit 7 then inverts the semiconductor wafer 11 to bury the micro bumps 111, the pillars 123, and the test pads 103 in an adhesive layer 126. The adhesive layer 126 may be a part of a dicing tape (not shown). The adhesive layer 126 is made of an UV-curable adhesive, for example. Further, the separation unit 7 provides a resist patterning (mask) 125 on the substrate 100. The resist mask 125 is on the opposite side of the substrate 100 relative to the adhesive layer 126. Further, the resist mask 125 is provided with mask apertures (slits) 127 whose position corresponds to the scribe circuit 121.

Figure 4F:
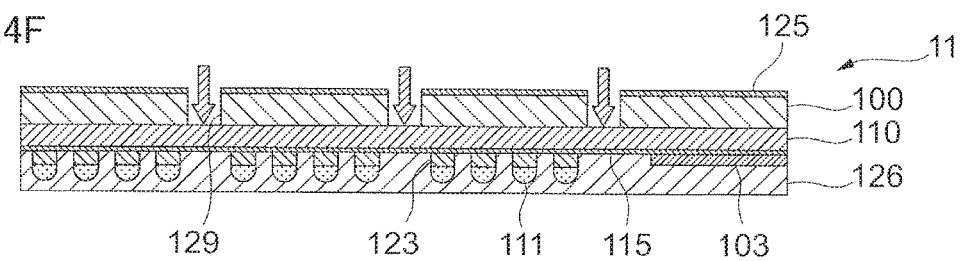
Figure 4G:
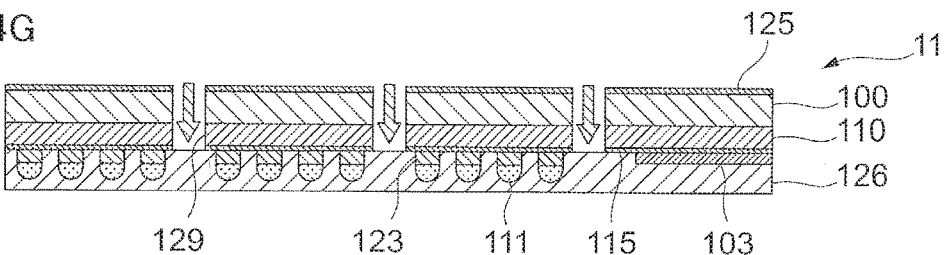

As shown in FIGS. 4F and 4G, the separation unit 7 then cuts the semiconductor wafer 11 by RIE to separate individual small-dies 9. More specifically, the separation unit 7 cuts the substrate 100 in the scribe circuit 121 by Si RIE (see FIGS. 4F and 5B), making grooves 129 through the apertures 127. The separation unit 7 then cuts the base circuit 110 and the wiring circuits 115 by metal RIE (see FIGS. 4G and 5C), deepening the grooves 129. Note that the process shown in FIGS. 4E, 4F, 4G corresponds to the above mentioned cutting step.

After that, the separation unit 7 inverts the small-dies 9 to mount them on a mounting substrate (not shown), for example. The adhesive layer 126 is then peeled off by being irradiated with UV light. Note that the semiconductor wafer 11 is taken over by a 3D or 2.5D packaging process.

Hereinafter, a configuration around the scribe circuit 121 will be explained. A width Lx of the scribe circuit 121 (see FIG. 5A) is preferably between about 5 um to 20 um. While any dimension can be employed, the width Lx less than 5 um may lead to a cut failure in RIE, and the width Lx more than 20 um may decrease the number of effective small-dies 9 obtained from a single semiconductor wafer 11. In the example shown in the figure, the width Lx of the scribe circuit 121 is, e.g., 15 um. Note that the width Lx may be narrower than the pitch of the micro bumps 111. The width Lx may also be narrower than the pitch of the test pads 103.

In the present exemplary embodiment, the circuit wires 131 are discontinuous in areas to be etched by RIE. In other words, the ends of the circuit wires 131 included in the chip areas 101 are set back from the grooves 129 (see distance Ly in FIG. 5B). Similarly, the ends of the circuit wires 131 included in the scribe circuit 121 are set back from the chip areas 101 (refer to distance Lz in FIG. 5B). That is to say, the circuit wires 131 are set apart from a boundary between the chip areas 101 and the scribe circuit 121. Here, the RIE/dicing can be conducted through the scribe circuit 121 leaving the die edge seal 113 intact.

Note that a width Lw (see FIG. 5C) of the circuit wires 131 included in the scribe circuit 121 is 5 um, for example. The width Lw is narrower than the width Lx of the scribe circuit 121. This enables the both ends of the circuit wires 131 included in the scribe circuit 121 to remain unexposed after the RIE/dicing.

Note that the wiring circuits 115 are made of an aluminum layer since raw copper metal edges cannot be exposed after the dicing cut. Further, the circuit wires 131 in the scribe circuit 121 can be sequentially loaded to individualize the codes and a shared timing signal used to load data into each small-die 9 in parallel at the end.

The present exemplary embodiment reduces manufacturing costs of the small-dies 9. The present exemplary embodiment conducts the logic test and the chip initialization in parallel at a wafer level. The present exemplary embodiment reduces the size of the small-die 9.

In the present exemplary embodiment, the write process to the chip area 101 provided in the small-dies 9 is only performed at a wafer-level initialization time. Therefore, there is no-way to compromise the nonvolatile memory data during an operational time. Data may be a key and initial-bootloader code. The present exemplary embodiment thus securely performs the initialization process of the small-dies 9.

Figure 6:
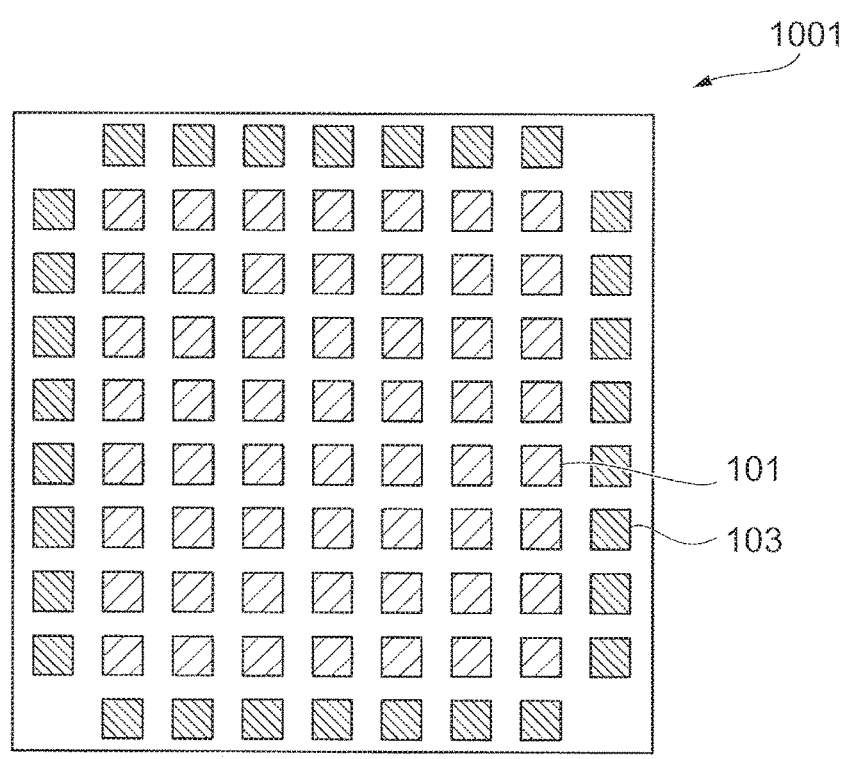
FIG. 6 depicts a schematic view of a super-die according to another exemplary embodiment of the present invention.

FIG. 6 depicts a schematic view of a super-die 1001 according to another exemplary embodiment of the present invention.

The configuration of the super-die 10 is not limited to the above mentioned exemplary embodiment. For example, the super-die 1001 may be configured as shown in FIG. 6. The super-die 1001 may include test pads 103 surrounding the chip areas 101.

Here, in the above mentioned exemplary embodiment, the test and initialization step is conducted on the semiconductor wafer 11. The test and initialization step may be conducted on the super-die 10 having cut out from the semiconductor wafer 11. In other words, the test and initialization step may be conducted after the cutting step.

Note that the small-die 9 may be any semiconductor chip. For example, the small-die 9 may be a computer, a memory, or a sensor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for testing a chip area comprising:
    fabricating a chip intermediate body including a semiconductor region, a cut region, a contact region, a test area, and electric wiring, the semiconductor region including a plurality of chip areas arranged as an array and respectively cut out as semiconductor chips, the cut region being provided along edges of the chip areas, the cut region being cut to cut out the semiconductor chips, the contact region being provided opposite to the chip areas across the cut region with a contact pad corresponding to each row of chip areas in the array, the test area including a test circuit corresponding to each column of chip areas in the array, the electric wiring being provided continuously with the cut region to connect the chip areas and the contact region; and
    testing the chip areas in parallel with a probe of a test unit contacting the contact region.

2. A method for fabricating a semiconductor chip comprising:
    testing a semiconductor region provided on a chip intermediate body with a probe of a test unit, the chip intermediate body including the semiconductor region, a cut region, a contact region, a test area, and electric wiring, the semiconductor region including a plurality of chip areas arranged as an array and respectively cut out as semiconductor chips, the cut region being provided along edges of the chip areas, the cut region being cut to cut out the semiconductor chips, the contact region being provided opposite to the chip areas across the cut region with a contact pad corresponding to each row of chip areas in the array, the test area including a test circuit corresponding to each column of chip areas in the array, the electric wiring being provided continuously with the cut region to connect the chip areas and the contact region; and
    cutting the cut region to cut out the semiconductor chips.

3. The method as recited in claim 1, wherein testing the chip areas in parallel includes writing initial data to the chip areas using test circuits provided opposite to the chip areas across the cut region to detect logic functionality.

4. The method as recited in claim 1, further including initializing each of the chip areas in a wafer-level initialization for chip areas that pass the testing.

5. The method as recited in claim 4, wherein the initialization includes loading each chip area with a key and initial-bootloader code.

6. The method as recited in claim 4, wherein the wafer-level initialization initializes every chip area in parallel.

7. The method as recited in claim 2, wherein testing the chip areas in parallel includes writing initial data to the chip areas using test circuits provided opposite to the chip areas across the cut region to detect logic functionality.

8. The method as recited in claim 2, further including initializing each of the chip areas in a wafer-level initialization for chip areas that pass the testing.

9. The method as recited in claim 8, wherein the initialization includes loading each chip area with a key and initial-bootloader code.

10. The method as recited in claim 8, wherein the wafer-level initialization initializes every chip area in parallel.

* * * * *